Sept. 27, 1955 E. H. HUGENHOLTZ 2,719,231
OSCILLATOR FREQUENCY CONTROL
Filed Aug. 13, 1948
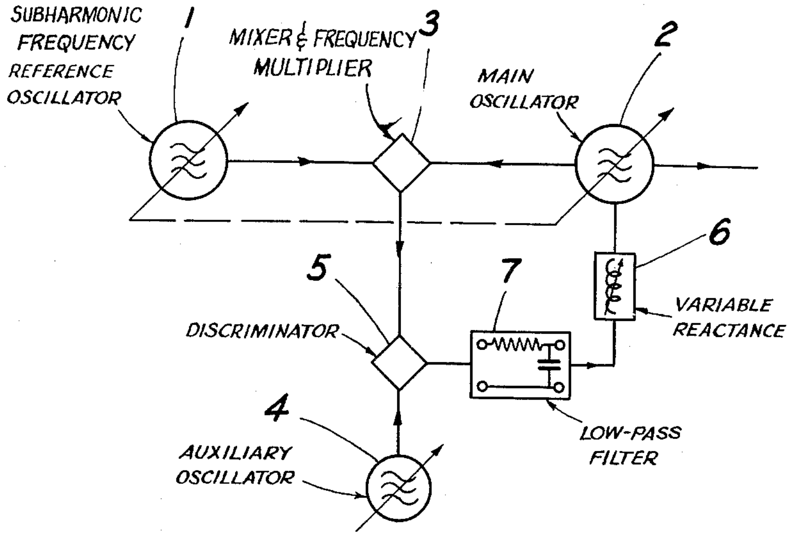
INVENTOR.
EDUARD HERMAN HUGENHOLTZ
BY Fred M Vogel
AGENT United States Patent Office 2,719,231

Patented Sept. 27, 1955

2,719,231

OSCILLATOR FREQUENCY CONTROL

Eduard Herman Hugenholtz, Eindhoven, Netherlands, assignor to Hartford National Bank and Trust Company, Hartford, Conn., as trustee Application August 13, 1948, Serial No. 43,985

Claims priority, application Netherlands September 26, 1947

7 Claims. (Cl. 250—36)

This invention relates to an arrangement comprising an oscillator which is furnished with an automatic frequency corrector for stabilizing the oscillator frequency to the frequency of a sinusoidal stabilization signal which is derived from the frequency of a control oscillator.

In such arrangements the control frequency either may correspond with the desired oscillator frequency or a definite frequency-difference may be maintained between these two frequencies. For instance, an auxiliary control oscillation having the desired and, as the case may be, variable frequency-difference may, for maintaining a definite frequency-difference, be derived from an auxiliary control-oscillation oscillator, and the control voltage required for automatic frequency correction (AFC) may be obtained by mixing this auxiliary control oscillation with the difference or beat frequency of oscillator-frequency and control-frequency.

In arrangements of the aforesaid type the control frequency may be taken from an arbitrary stable oscillator, for instance a crystal oscillator or an oscillator which is synchronized itself by means of a further control oscillation, for example a pulse-shaped voltage.

We have found that in arrangements of the aforesaid type, wherein the AFC control voltage is obtained by mixing the signal of the stable oscillator (stabilization signal) and the signal of the AFC-controlled oscillator, the tuning of the oscillator supplying the stabilization signal is influenced in an undesired manner by the AFC-controlled oscillator, more particularly if the latter and the stabilization oscillator are commonly tunable, for example with the use of single knob tuning.

It has surprisingly been found that this troublesome reaction occurs not only if the stabilization signal and the oscillator signal have the same frequencies, but also if a considerable frequency difference (say 200 to 300 kilocycles/sec.) between the frequency of the stabilized oscillator signal and the stabilization signal is maintained by making use of an auxiliary control-oscillator in the aforesaid manner.

The present invention has for its object to provide a simple means for avoiding the disturbing influence of these reaction phenomena.

According to the invention, in a device comprising an oscillator which is required to be stabilized by means of a sinusoidal voltage, the control-oscillator supplying the stabilization signal is tuned to a frequency corresponding to a subharmonic of the control-frequency desired for AFC, the amplitude of the stabilization signal supplied to the mixer stage being chosen to be so high that considerable distortion of the stabilization signal occurs in the mixer stage in which the stabilization signal and the oscillator signal are mixed for obtaining the control voltage, thus producing in the mixer a control oscillation having the desired control-frequency.

It has been found advantageous to make the control frequency double the frequency of the stabilization signal.

In order that the invention may be clearly understood and readily carried into effect it will now be described more fully with reference to the accompanying drawing, given by way of example.

The circuit-arrangement shown in the drawing comprises a tunable, stable reference oscillator 1 producing a sinusoidal stabilization signal. The reference numeral 2 denotes a main oscillator which is required to be stabilized by this signal, which oscillator is also tunable and of which the frequency is required to be controlled in such manner as to maintain a definite frequency difference with respect to the control frequency. As indicated by arrows, the reference oscillator 1 and the main oscillator 2 are commonly tunable.

According to the invention, the frequency of the sinusoidal stabilization signal produced by the reference oscillator 1 is chosen to be half the desired control-frequency.

The desired control-frequency is obtained by deforming the sinusoidal reference signal, and this by supplying it with an excessive amplitude to a mixer stage 3 which is provided for producing the AFC control-voltage and may, for instance, consist of a hexode mixer tube.

Consequently higher harmonics of the frequency of the sinusoidal stabilization signal, and hence the desired control frequency, occur in the mixer stage 3, and the latter frequency is mixed with the signal of the main oscillator 2 which signal is likewise supplied to the mixer stage 3 and the frequency of which is required to be stabilized.

From the output circuit of the mixer stage 3 the difference or beat frequency of the frequency-doubled stabilization signal and the oscillator signal is taken, which frequency must be maintained to a predetermined value of say 200 to 300 kilocycles/sec. To this end this beat-frequency is compared with the frequency of another stable auxiliary oscillator 4 having a preferably adjustable frequency, by supplying the beat signal and the auxiliary oscillator signal to another mixer stage 5 which serves as a so-called beat-frequency discriminator and at the output circuit of which a control voltage suitable for correcting the tuning of the main oscillator 2 occurs. This control voltage controls a variable reactance 6, for instance a reactance tube circuit, which is coupled with the frequency-determining circuit of the main oscillator 2 in such manner that the difference in frequency of the control-frequency and the frequency of the signal of the main oscillator 2 corresponds to the frequency of the auxiliary control-oscillation signal produced by the auxiliary oscillator 4.

To suppress in the control voltage any undesired combination-frequencies produced in the mixer stage 5, it is desirable that the control voltage should be supplied, through a low-pass filter 7, to the variable reactance 6 as has been explicitly described in my prior patent application, now Patent No. 2,605,425, issued July 20, 1952.

With the use of the aforesaid multiplication of the frequency of the stabilization signal in the mixer stage 3, troublesome reaction no longer occurs even if the oscillators 1 and 2 are commonly tuned and, the additional advantage is obtained that the reference oscillator is tuned to a comparatively low frequency with result that given conditions with respect to stability can be satisfied in a simpler manner. Notably if the frequency of the main oscillator 2 to be stabilized is high, for instance 10 megacycles/sec. or more, this may be utilized to advantage.

What I claim is:

1. Apparatus for automatically maintaining a predetermined frequency relation between a wave to be stabilized and a control oscillation, comprising a main oscillator for generating said wave to be stabilized, a reference oscillator for generating a sinusoidal stabilized oscillation whose frequency is a sub-harmonic of the control oscillation, a signal-responsive frequency control device operatively coupled to said main oscillator, a frequency mixer having a distortion characteristic for waves greater than a given amplitude and thereby being adapted to produce harmonic components of an applied wave when the said applied wave exceeds said given amplitude, means to apply the wave from said main oscillator as an input to said mixer, means to apply the stabilized oscillation from said reference oscillator as an input to said mixer with an amplitude exceeding said given amplitude thereby to produce distortion thereof in said mixer to develop a control oscillation therein which is a harmonic of said stabilized oscillation and producing in said mixer a heterodyne control signal having a frequency determined by the algebraic sum of the frequency value of said main oscillator wave and the frequency value of said harmonic of said stabilized oscillation, and means to apply said control signal to said control device to maintain said predetermined relation between said wave and said control oscillation.

2. Apparatus, as set forth in claim 1, wherein the frequency of said control oscillation is twice the frequency of said stabilized oscillation.

3. In combination, a main oscillator producing an electrical wave to be stabilized by a control oscillation and having a frequency determining resonant circuit, a reference oscillator generating a sinusoidal stabilized oscillation which is a subharmonic of said control oscillation, a signal-responsive variable reactance device coupled to the resonant circuit of said main oscillator to control the frequency thereof, a frequency mixer coupled both to said main oscillator and said reference oscillator and having a distortion characteristic for waves greater than a given amplitude and thereby being adapted to produce harmonic components of an applied wave when the said applied wave exceeds said given amplitude, said reference oscillator producing a stabilized oscillation having an amplitude exceeding said given amplitude thereby to produce distortion thereof in said mixer to develop a control oscillation therein whose frequency is a harmonic of said stabilized oscillation and producing in said mixer a heterodyne control signal having a frequency determined by the algebraic sum of the frequency value of said main oscillator wave and the frequency value of said harmonic of said stabilized oscillation, and means to apply said control signal to said reactance device to maintain a predetermined relation between said wave and said control oscillation.

4. In a system for automatically maintaining a predetermined frequency relation between a wave to be stabilized and a control oscillation, a main oscillator for generating said wave to be stabilized, a reference oscillator for generating a sinusoidal stabilized oscillation which is a sub-harmonic of said control oscillation, means for producing a control signal depending on the frequency displacement between said wave and said control oscillation comprising a frequency mixer having a distortion characteristic for waves greater than a given amplitude and thereby being adapted to produce harmonic components of an applied wave when the said applied wave exceeds said given amplitude, means to apply the wave from said main oscillator as an input to said mixer, means to apply the stabilized oscillation from said reference oscillator as an input to said mixer with an amplitude exceeding said given amplitude thereby to produce distortion thereof in said mixer to develop a control oscillation therein which is a harmonic of said stabilized oscillation and producing in said mixer a heterodyne control signal having a frequency determined by the algebraic sum of the frequency value of said main oscillator wave and the frequency value of said harmonic of said stabilized oscillation.

5. Apparatus for automatically maintaining a predetermined frequency difference between a wave to be stabilized and a control oscillation, comprising a main oscillator for generating said wave to be stabilized, a reference oscillator for generating a sinusoidal stabilized oscillation whose frequency is a sub-harmonic of said control oscillation, a signal-responsive frequency control device operatively coupled to said main oscillator, a frequency mixer having a distortion characteristic for waves greater than a given amplitude and thereby being adapted to produce harmonic components of an applied wave when the said applied wave exceeds said given amplitude, means to apply the wave from said main oscillator as an input to said mixer, means to apply the stabilized oscillation from said reference oscillator as an input to said mixer with an amplitude exceeding said given amplitude thereby to produce distortion thereof in said mixer to develop a control oscillation therein which is a harmonic of said stabilized oscillation and producing in said mixer an intermediate oscillation having a frequency determined by the algebraic sum of the frequency value of said main oscillatory wave and the frequency value of said harmonic of said stabilized oscillation, an auxiliary oscillator producing an auxiliary oscillation whose frequency corresponds to said predetermined frequency difference, a beat-frequency discriminator, means to apply the intermediate oscillation yielded by said mixer and the auxiliary oscillation produced by said auxiliary oscillator as an input to said discriminator to produce a control signal depending on the frequency difference therebetween, and means to apply said control signal to said control device to maintain said predetermined freqeuncy difference between said main oscillator wave and said control oscillation.

6. Apparatus, as set forth in claim 5, wherein said reference oscillator, said main oscillator and said auxiliary oscillator are each tunable, and further including means for simultaneously tuning said main oscillator and said reference oscillator.

7. In combination, a main oscillator producing an electrical wave to be stabilized by a control oscillation and having a frequency-determining resonant circuit, a reference oscillator generating a sinusoidal stabilized oscillation which is a subharmonic of said control oscillation, a signal-responsive variable reactance device operatively coupled to said resonant circuit to control the frequency of said main oscillator, a frequency mixer coupled to said main oscillator and to said reference oscillator and having a distortion characteristic for waves greater than a given amplitude and thereby being adapted to produce harmonic components of an applied wave when the said applied wave exceeds said given amplitude, said reference oscillator producing a stabilized oscillation having an amplitude exceeding said given amplitude thereby to produce distortion thereof in said mixer thereby to develop in said mixer a control oscillation which is a harmonic of said stabilized oscillation and whose frequency is double the frequency of said stabilized oscillation and producing in said mixer an intermediate oscillation whose frequency is equal to the algebraic sum of the frequency value of said main oscillator and the frequency value of said harmonic of said stabilized oscillation, an auxiliary oscillator producing an auxiliary oscillation whose frequency corresponds to a predetermined frequency difference between said main oscillator wave and said control oscillation, a beat-frequency discriminator coupled to the output of said mixer and said auxiliary oscillator to develop a signal voltage depending on the frequency displacement between said intermediate oscillation and said auxiliary oscillation, a low-pass filter, and means to apply said control voltage through said low-pass filter to said variable reactance device to maintain said predetermined frequency difference between said control oscillation and said main oscillator wave.

References Cited in the file of this patent

UNITED STATES PATENTS 1,450,966 Affel ---------- Apr. 10, 1923
2,206,695 Guanella ---------- July 2, 1940

2,406,125 Ziegler et al. ---------- Aug. 20, 1946
2,455,393 Varian ---------- Dec. 7, 1948
2,474,278 Ranger ---------- June 28, 1949
2,521,070 Linder et al. ---------- Sept. 5, 1950
2,552,140 Boothroyd et al. ---------- May 8, 1951
2,574,482 Hugenholtz ---------- Nov. 13, 1951